United States Patent
Son et al.

(10) Patent No.: US 9,551,771 B2
(45) Date of Patent: Jan. 24, 2017

(54) MAGNETIC RESONANCE IMAGE (MRI) APPARATUS AND METHOD FOR OBTAINING MRI IMAGE BY MODIFYING MOTION OF SUBJECT

(71) Applicant: Samsung Electronics Co., Ltd., Suwon-si (KR)

(72) Inventors: Jong-bum Son, Seongnam-si (KR); Seong-deok Lee, Seongnam-si (KR); Jae-mock Yi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 619 days.

(21) Appl. No.: 14/048,609

(22) Filed: Oct. 8, 2013

(65) Prior Publication Data

US 2014/0097839 A1   Apr. 10, 2014

(30) Foreign Application Priority Data

Oct. 10, 2012   (KR) .................. 10-2012-0112659

(51) Int. Cl.
| | | |
|---|---|---|
| *G01V 3/00* | (2006.01) | |
| *G01R 33/565* | (2006.01) | |
| *G01R 33/567* | (2006.01) | |
| *G01R 33/56* | (2006.01) | |

(52) U.S. Cl.
CPC ..... *G01R 33/56509* (2013.01); *G01R 33/5676* (2013.01); *G01R 33/5607* (2013.01)

(58) Field of Classification Search
CPC . A61B 5/055; G01R 33/4828; G01R 33/5608; G01R 33/4818; G01R 33/543

USPC ......................................................... 324/309
See application file for complete search history.

(56) References Cited

U.S. PATENT DOCUMENTS

| | | | |
|---|---|---|---|
| 5,800,354 | A | 9/1998 | Hofland et al. |
| 7,646,198 | B2 | 1/2010 | Bookwalter et al. |
| 7,863,895 | B2 | 1/2011 | Ma |
| 7,945,079 | B2 | 5/2011 | Rosen |
| 8,030,921 | B2 | 10/2011 | Bookwalter et al. |
| 2007/0038071 | A1* | 2/2007 | Nauerth ............ G01R 33/5676 600/410 |
| 2007/0057672 | A1 | 3/2007 | Hargreaves et al. |
| 2008/0107233 | A1* | 5/2008 | Sakaguchi ........... A61B 6/4233 378/91 |
| 2010/0260397 | A1 | 10/2010 | Block et al. |
| 2011/0267054 | A1 | 11/2011 | He et al. |
| 2012/0176132 | A1* | 7/2012 | Nishihara ............ A61B 5/055 324/309 |

FOREIGN PATENT DOCUMENTS

| | | |
|---|---|---|
| JP | 2004-305454 | 11/2004 |
| JP | 2007-143626 | 6/2007 |
| KR | 10-2007-0031804 | 3/2007 |
| KR | 10-2011-0025413 A | 3/2011 |

* cited by examiner

*Primary Examiner* — Walter L Lindsay, Jr.
*Assistant Examiner* — Frederick Wenderoth
(74) *Attorney, Agent, or Firm* — NSIP Law

(57) ABSTRACT

Provided are a method and apparatus for obtaining a magnetic resonance imaging (MRI) image of a subject. Typically, MRI image processing that incorporates fat suppression takes a large amount of time to complete. According to various aspects, image processing that incorporates fat suppression may be postponed until MRI data is repeatedly obtained. By doing so, for example, more MRI data may be obtained during a time period of a heartbeat.

18 Claims, 8 Drawing Sheets

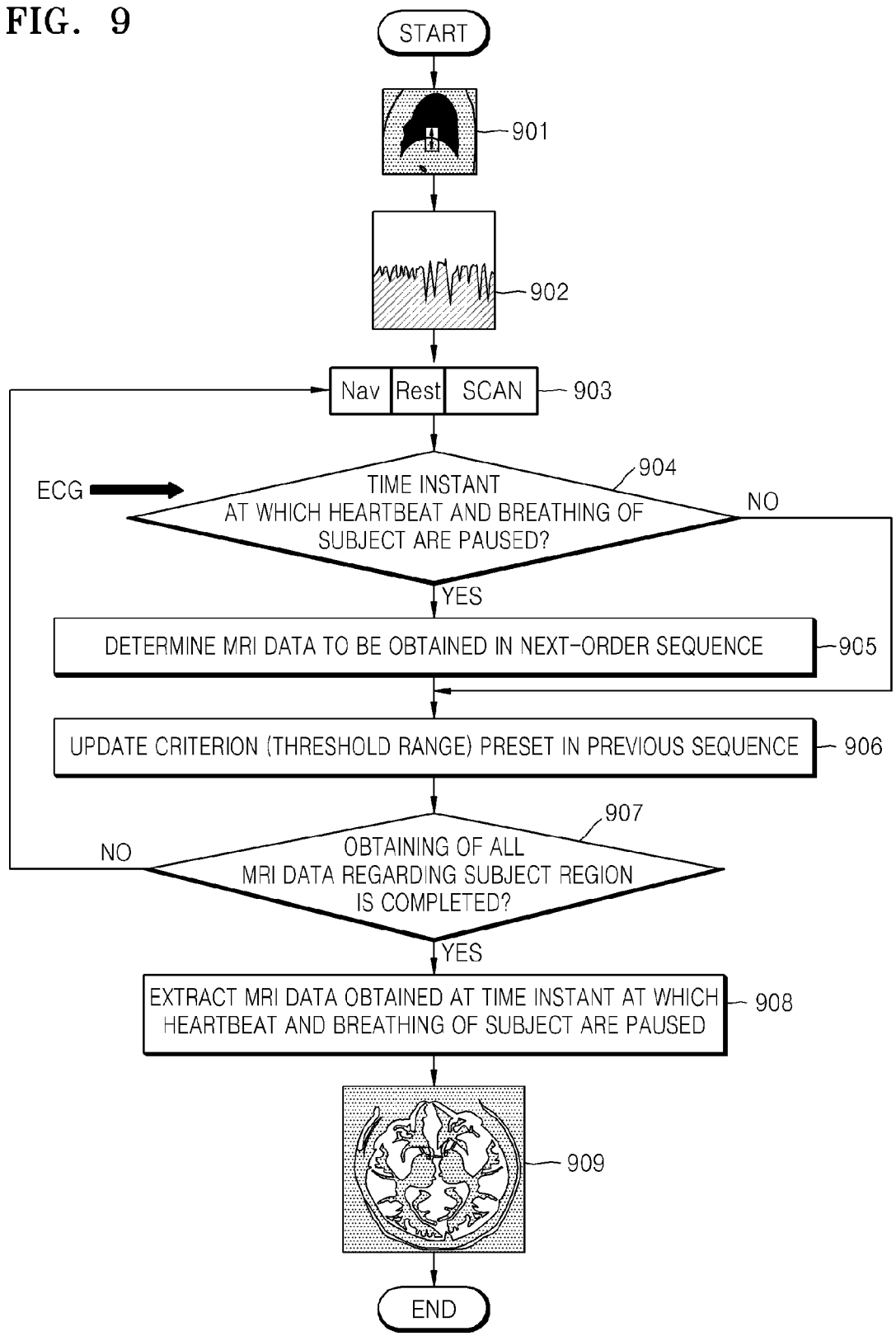

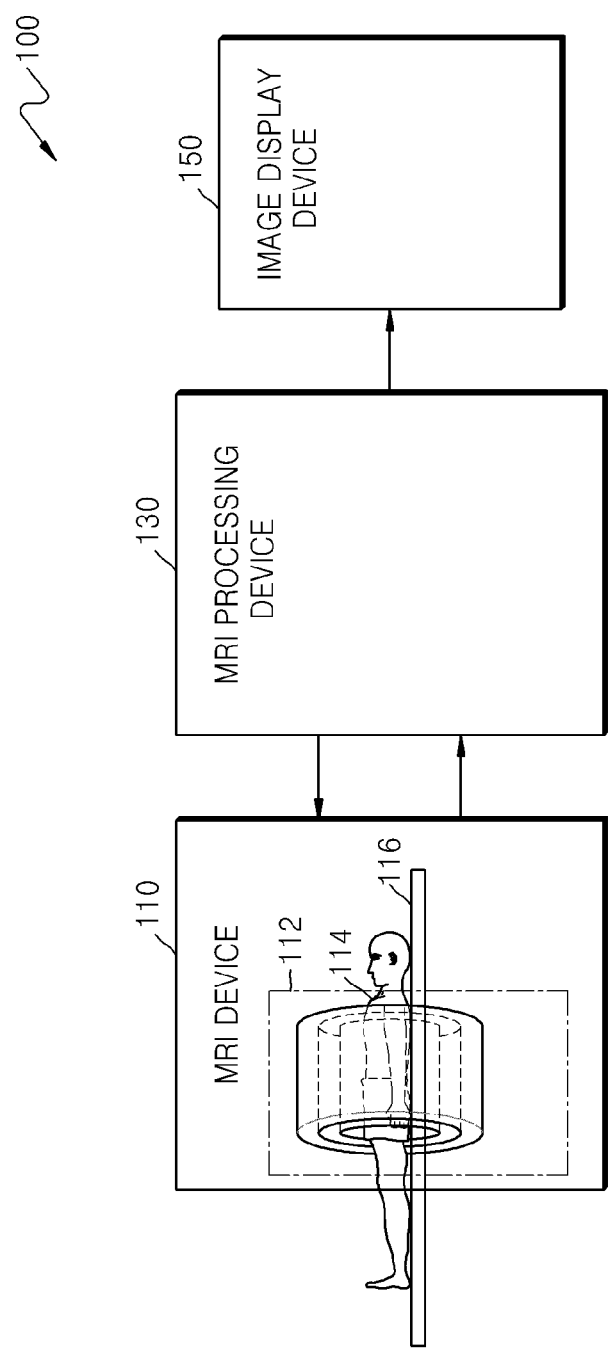

MAGNETIC RESONANCE IMAGE (MRI) APPARATUS AND METHOD FOR OBTAINING MRI IMAGE BY MODIFYING MOTION OF SUBJECT

CROSS-REFERENCE TO RELATED APPLICATION(S)

This application claims the benefit under 35 USC §119(a) of Korean Patent Application No. 10-2012-0112659, filed on Oct. 10, 2012, in the Korean Intellectual Property Office, the entire disclosure of which is incorporated herein by reference for all purposes.

BACKGROUND

1. Field

The following description relates to a magnetic resonance imaging (MRI) method and an apparatus for obtaining an MRI image by correcting motion of a subject.

2. Description of Related Art

Magnetic Resonance Imaging (MRI) generates an image by exposing an atomic nucleus of biological tissue of a subject to a magnetic field and applying resonance thereto. Resonance of the atomic nucleus refers to a phenomenon in which a particular high frequency signal is incident on the atomic nucleus that is in a state magnetized by an external magnetic field. For example, when in a low energy state, the atomic nucleus may absorb high-frequency energy, thus being excited to a high energy state. Atomic nuclei have different resonance frequencies according to their types, and the resonant frequencies are affected by the strength of an external magnetic field. For example, inside of a human body, numerous atomic nuclei exist. Typically a hydrogen atomic nucleus is used for MRI.

MRI provides images with finer details than other imaging technologies such as ultrasound. However, to obtain a MRI image may take a great deal of time in comparison to generating an image using ultrasound. Accordingly, it is difficult to use MRI in real-time technologies.

SUMMARY

In an aspect, there is provided a method of obtaining a magnetic resonance imaging (MRI) image, the method including repeatedly performing a sequence of obtaining a navigator image that tracks breathing of a subject and obtaining MRI data of a subject region, multiple times, during a predetermined time period, extracting MRI data obtained at a point of time at which a heartbeat and the tracked breathing of the subject are paused, based on the obtained navigator images, and generating an MRI image of the subject region by transforming the extracted MRI data through fat suppression, in response to the extraction of the MRI data being completed.

The sequence may be performed at least twice during a period of a single heartbeat of the subject.

The method may further comprise determining whether a navigator image obtained in a current sequence is an image taken at a point of time at which the breathing of the subject is paused, and determining MRI data to be obtained in a next-order sequence based on whether the navigator image obtained in the current sequence is an image corresponding to the point of time at which breathing of the subject is paused, wherein the performing of the sequence may comprise performing the next-order sequence based on the result of the determining MRI data to be obtained in the next-order sequence.

The method may further comprise updating a preset criterion of a previous sequence for determining the point of time at which the breathing of the subject is paused, based on the navigator image obtained in the current sequence, wherein the determining whether the navigator image obtained in a current sequence is an image taken at a point of time at which breathing of the subject is paused is based on the criterion which is preset in the previous sequence.

The determining whether the navigator image obtained in the current sequence and the updating of the criterion may be performed by analyzing a position of a diaphragm of the subject included in the obtained navigator image.

The updating of the preset criterion may comprise updating the criterion in a moving window scheme, by analyzing a position of a diaphragm of the subject included in the navigator image obtained in the current sequence.

The navigator image obtained may be one of a one-dimensional (1D) image, a two-dimensional (2D) image, and a three-dimensional (3D) image.

The MRI data obtained during the performing of a sequence is data corresponding to one line of k-space.

In an aspect, there is provided a non-transitory computer-readable storage medium comprising a program that when executed by a computer, causes the computer to perform the method.

In an aspect, there is provided a method of obtaining a magnetic resonance imaging (MRI) image, the method including obtaining a navigator image which tracks a position of a predetermined region of a subject that moves due to breathing of the subject, obtaining MRI data regarding a subject region of the subject, determining a point of time at which the breathing of the subject is paused, based on the tracked position of the predetermined region of the obtained navigator image, and updating a preset criterion for determining the point of time at which the breathing of the subject is paused, based on the tracked position of the predetermined region, wherein the obtaining the navigator image, the obtaining the MRI data, the determining, and the updating are performed at least twice during a single heartbeat of the subject.

The method may further comprise extracting MRI data obtained at a point of time at which the heartbeat and breathing of the subject are paused, based on a result of the determining the point of time at which the breathing of the subject is paused, and generating an MRI image of the subject region by transforming the extracted MRI data through fat suppression, in response to the extraction of the MRI data being completed.

In an aspect, there is provided a magnetic resonance imaging (MRI) apparatus for obtaining an MRI image, the MRI apparatus including a main control unit configured to repeatedly perform a sequence of obtaining a navigator image that tracks breathing of a subject and obtaining MRI data of a subject region, multiple times, during a predetermined time period, an MRI data extracting unit configured to extract MRI data obtained at a point of time at which a heartbeat and the tracked breathing of the subject are paused, based on the obtained navigator images, and an MRI image generating unit configured to generate an MRI image of the subject region by transforming the extracted MRI data through fat suppression, in response to the extraction of the MRI data being completed.

The main control unit may control the sequence to be performed at least twice during a period of a single heartbeat of the subject.

The MRI apparatus may further comprise a navigator image determining unit configured to determine whether a navigator image obtained in a current sequence is an image corresponding to a point of time at which the breathing of the subject is paused, and an MRI data determining unit configured to determine MRI data to be obtained in a next-order sequence based on a result of the determining whether the navigator image obtained in the current sequence is an image corresponding to the point of time at which breathing of the subject is paused, wherein the main control unit controls the next-order sequence based on the result of the determining MRI data to be obtained in the next-order sequence.

The MRI apparatus may further comprise an updating unit configured to update a preset criterion for determining the point of time at which the breathing of the subject is paused, based on the navigator image obtained in the current sequence, wherein the navigator image determining unit is configured to determine whether the navigator image is an image corresponding to a point of time at which the breathing of the subject is paused, based on the criterion which is preset in the previous sequence.

The updating unit may be configured to update the preset criterion in a moving window scheme, by analyzing a position of a diaphragm of the subject included in the navigator image obtained in the current sequence.

The navigator image obtained during a sequence may be one of a one-dimensional (1D) image, a two-dimensional (2D) image, and a three-dimensional (3D) image.

The MRI data obtained during a sequence may be data corresponding to one line of a k-space.

In an aspect, there is provided a magnetic resonance imaging (MRI) apparatus for obtaining an MRI image, the MRI apparatus including an MRI data obtaining unit configured to obtain a navigator image which tracks a position of a predetermined region of a subject that moves due to breathing of the subject, and MRI data regarding a subject region of the subject, a navigator image determining unit configured to determine a point of time at which the breathing of the subject is paused, based on the tracked position of the predetermined region in the obtained navigator image, an updating unit configured to update a preset criterion for determining the point of time at which the breathing of the subject is paused, based on the tracked position of the predetermined region, and a main control unit configured to control the MRI data obtaining unit to obtain the navigator image and to obtain the MRI data at least twice during a period of a single heartbeat of the subject.

The MRI apparatus may further comprise an MRI data extracting unit configured to extract MRI data obtained at a point of time at which the heartbeat and breathing of the subject are paused, based on a result of the determining the point of time at which the breathing of the subject is paused, and an MRI image generating unit configured to generate an MRI image of the subject region by transforming the extracted MRI data through fat suppression, in response to the extraction of the MRI data being completed.

Other features and aspects may be apparent from the following detailed description, the drawings, and the claims.

BRIEF DESCRIPTION OF THE DRAWINGS

FIG. 9 is a diagram illustrating another example of a method of obtaining an MRI image.

FIG. 10 is a diagram illustrating an example of an MRI system.

Figure 1:
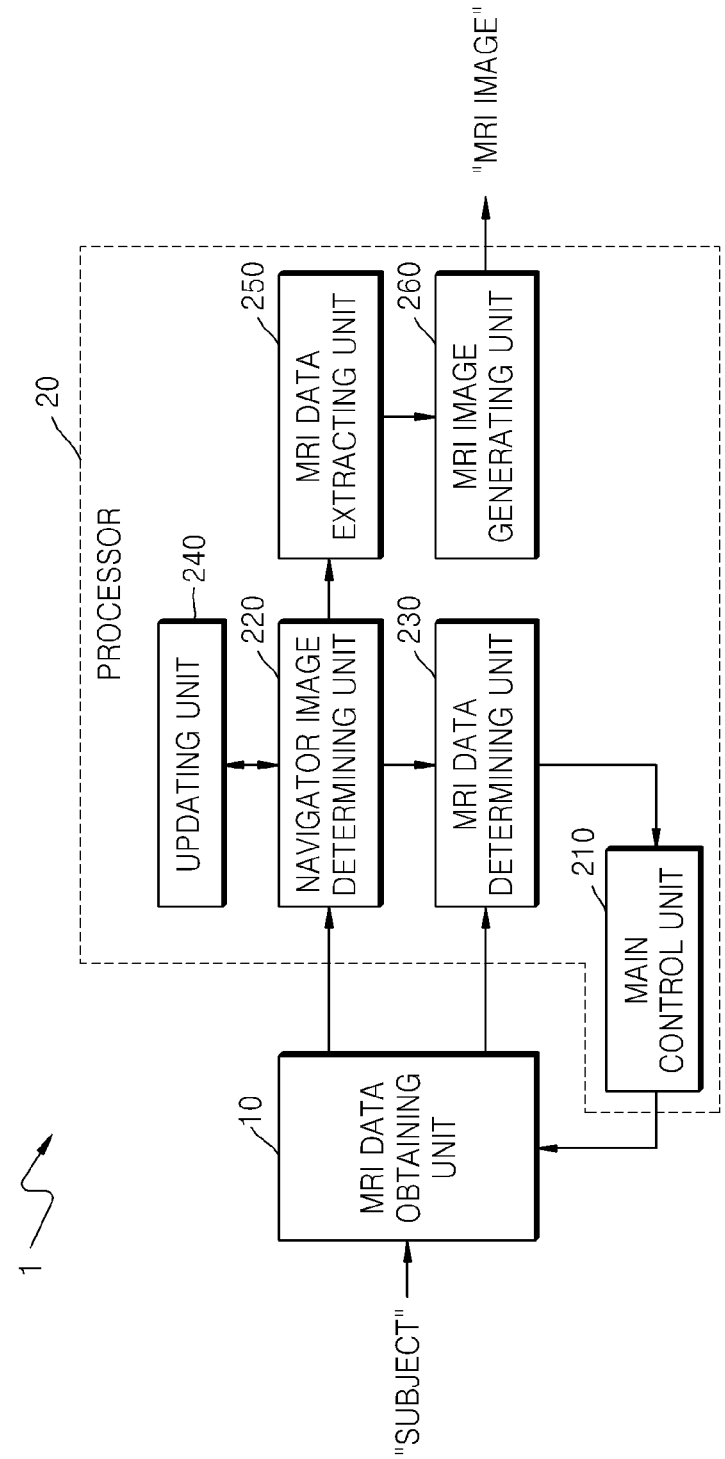
FIG. 1 a diagram illustrating an example of a magnetic resonance imaging (MRI) apparatus.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 illustrates an example of a magnetic resonance imaging (MRI) apparatus 1. Referring to FIG. 1, the MRI apparatus 1 includes an MRI data obtaining unit 10 and a processor 20. In this example, the processor 20 includes a main control unit 210, a navigator image determining unit 220, an MRI data determining unit 230, an updating unit 240, an MRI data extracting unit 250, and an MRI image generating unit 260. However, it should be appreciated that the MRI apparatus 1 may include hardware components other than the hardware components shown in FIG. 1.

For example, the processor 20 is shown as one processor in FIG. 1, but the processor 20 may include multiple processors and may be implemented with an array of multiple logic gates. As another example, the processor 20 may be implemented with a combination of a general-purpose microprocessor and a memory having stored therein a program which can be executed by the microprocessor. Also, the processor 20 may be implemented with hardware in other forms.

The MRI apparatus 1 may obtain an image with information that is obtained by exposing an atomic nucleus of biological tissue of a subject to a magnetic field and applying resonance thereto. For example, the MRI apparatus 1 obtains a diagnostic image of the subject in a non-invasive manner using a magnetic field generated by a magnetic force.

Herein, the subject may be the body of a human being, but is not limited thereto. For example, the subject may refer to a body of an animal.

The MRI apparatus 1 may operate in combination with other medical imaging devices such as a positron emission tomography (PET) imaging device and the like.

Generally, instead of directly obtaining an image of a subject (human body), a conventional MRI apparatus may obtain MRI data by scanning a resonance frequency signal of a hydrogen atom of the subject, and may transform the obtained MRI data using a Fourier transform, thus obtaining an MRI image. However, the conventional MRI apparatus has a low scan speed. Accordingly, a great deal of time is spent in obtaining the MRI image.

FIG. 2 illustrates an example of a pulse sequence which is used to obtain an MRI image using a navigator technique in a conventional MRI apparatus. Referring to FIG. 2, when the navigator technique is used in the conventional MRI apparatus, four processes need to be performed within the period of a single heartbeat. For example, (1) image processing that incorporates fat suppression (duration of 220 ms or more), (2) 1D navigator imaging of a diaphragm (duration of 17 ms or more), (3) removal of a region of non-interest of a signal to avoid aliasing (equilibrium(rest) magnetization, duration of 10 ms or more), and (4) obtaining of MRI data corresponding to one line of a k-space (duration of 80 ms or more) need to be performed within a period of a heartbeat. In this example each process is given a duration value, however, it should be appreciated that each duration is merely an example for convenience of explanation and may be changed to other numerical values. In this example, image processing that incorporates fat suppression takes up the majority of the time of the four processes combined.

Figure 2A:
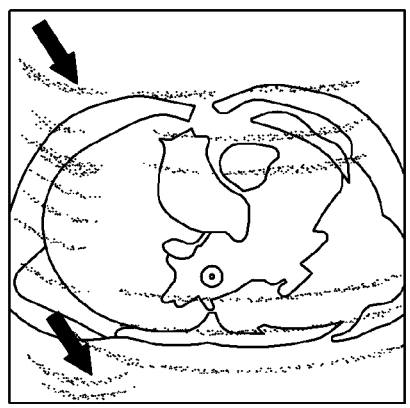
FIGS. 2A and 2B are diagrams illustrating an example of a pulse sequence which is used to obtain an MRI image using a navigator technique in a conventional MRI apparatus.
Figure 2B:
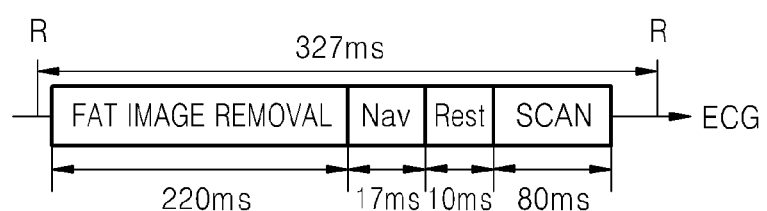

In the example of FIG. 2B, it takes approximately 327 ms or more to perform the four processes. In this example, if one period of a heartbeat is shorter than 327 ms, for example, due to a high heart rate, an MRI image may not be obtained within the period of the heartbeat. As an example, a heart rate of a normal person is 120 beats per minute which corresponds to a heartbeat every 500 ms, which is very close to minimum time of 327 ms necessary for using a navigator technique in a conventional MRI apparatus. In this case, if any one of the processes (1) through (4) exceeds an expected time, MRI data may not be able to be obtained within the period of the 500 ms heartbeat. Furthermore, even if the MRI data is obtained, it may be inaccurate.

Furthermore, in the conventional MRI apparatus, when a patient moves causing movement of an area being imaged, the sequence of events must be stopped and the four processes must be started over to ensure accuracy. Accordingly, a great deal of delay can occur due to simple motion of the patient, such as breathing.

According to various aspects, to solve problems which may occur when the navigator technique is used in the conventional MRI apparatus, the MRI apparatus 1 that is described herein is controlled to obtain more MRI data and generate an MRI image at high speed during one period of a heartbeat. Furthermore, to reduce the cumbersome work of stopping each of the above processes and newly setting a position of a diaphragm due to movement of a subject, the MRI apparatus 1 may update the position of the diaphragm in real time. An MRI image is thus generated at high speed without the need to stop all of the processes because of motion of the subject.

As described herein, a subject region may be a heart but is not limited thereto. Therefore, it should be appreciated that the subject region may also be another organ in the subject.

Referring again to FIG. 1, the MRI data obtaining unit 10 may apply a magnetic field and high frequency to a hydrogen atom of a biological tissue of a subject and may obtain MRI data from the subject in response to the application. For example, the MRI data obtaining unit 10 may be implemented with components such as a main magnetic field coil, a gradient coil, a radio frequency (RF) coil, a magnet room, and the like.

The main control unit 210 may control the MRI data obtaining unit 10 to obtain a navigator image which tracks breathing of the subject. For example, the main control unit 210 may control the MRI data obtaining unit 10 to obtain MRI data of a subject region. As an example, the main control unit 210 may control the MRI data obtaining unit 10 to obtain a navigator image once and obtain MRI data at least twice during one period of a heartbeat of the subject. Herein, assuming that the heart rate of the normal person is 120 beats per minute, one period of the heartbeat would be approximately 500 ms.

Image processing that incorporates fat suppression typically takes a large amount of time to complete. According to various aspects, the MRI apparatus 1, through the main control unit 210, may postpone image processing that incorporates fat suppression until all MRI data is obtained. By doing so, the MRI data obtaining unit 10 may obtain more MRI data during a time corresponding to one period of a heartbeat. By postponing image processing that incorporates fat suppression until a later time, for example, the MRI data obtaining unit 10 may obtain MRI data four times during one period of a heartbeat.

Figure 3:
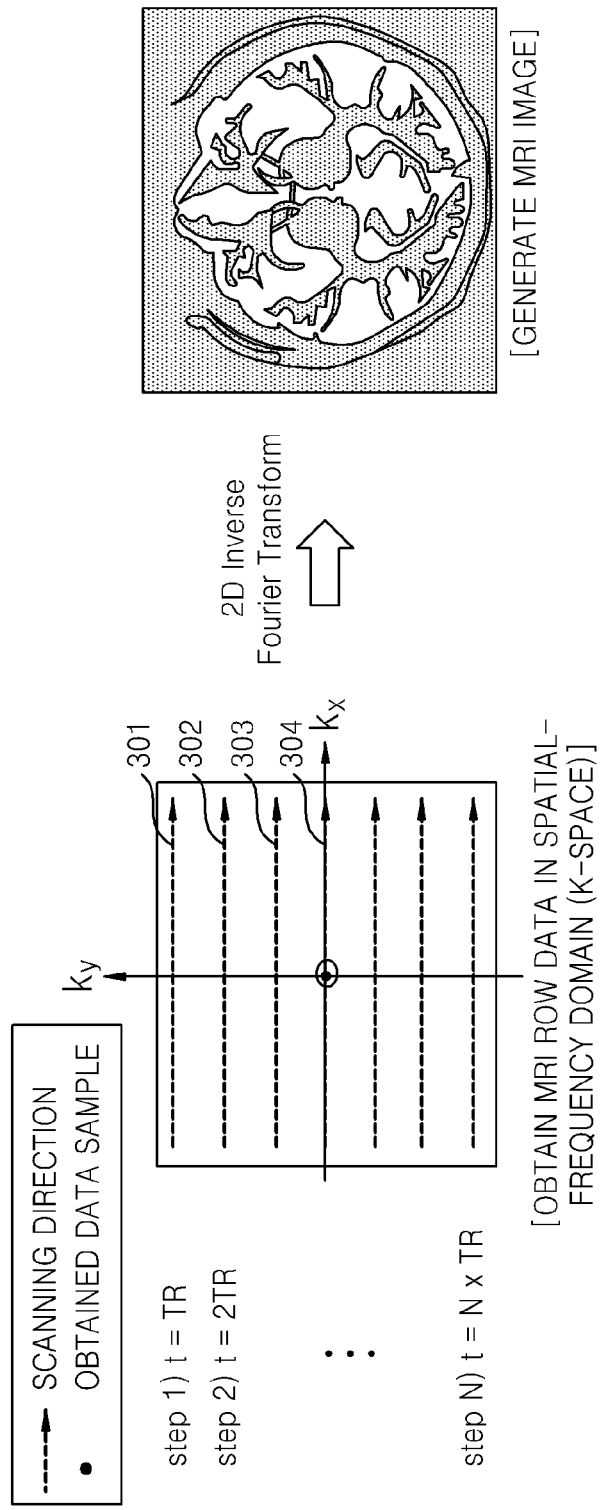
FIG. 3 is a diagram illustrating an example of a k-space generated from MRI data prior to generation of an MRI image, and the MRI image generated using the k-space.

FIG. 3 illustrates an example of a k-space generated from MRI data prior to generation of an MRI image and the MRI image generated using the k-space. Referring to FIG. 3, one line of the k-space corresponds to MRI data obtained from one sequence.

The main control unit 210 may control the MRI apparatus 1 such that image processing that incorporates fat suppression is not processed during a period of a heartbeat. As a result, a larger amount of MRI data may be obtained during the period of the heartbeat. In other words, MRI data corresponding to several lines 301, 302, 303, and 304 of the k-space may be obtained during one period of that heartbeat.

Figure 4:
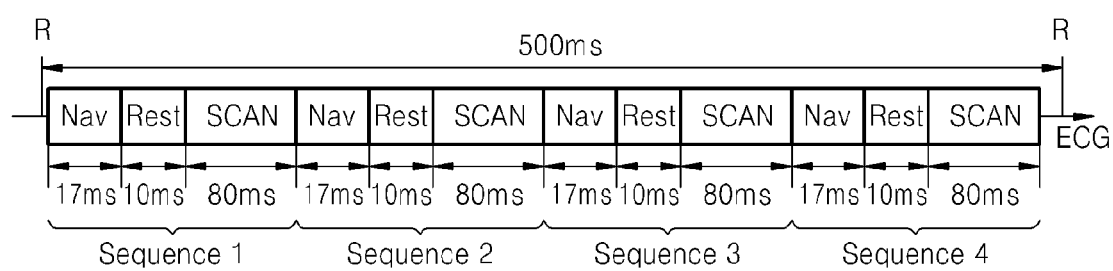
FIG. 4 is a diagram illustrating an example of a pulse sequence for controlling an MRI data obtaining unit by a main control unit.

FIG. 4 illustrates an example of a pulse sequence for controlling the MRI data obtaining unit 10 by the main control unit 210.

Referring to FIG. 4, the main control unit 210 may control the MRI data obtaining unit 10 to perform a sequence at least four times during a single 500 ms time period, or one period of a normal heartbeat. In this example, each sequence performed in the MRI apparatus 1 includes the processes of (1) navigator imaging of a diaphragm (duration of 17 ms or more), (2) removal of a region of non-interest of a signal to avoid aliasing (equilibrium(rest) magnetization, duration of 10 ms or more), and (3) obtaining of MRI data corresponding to one line of a k-space (duration of 80 ms or more). In this example, each sequence excludes image processing that incorporates fat suppression thus drastically reducing the overall processing time. It should be appreciated that the examples of the amounts of time taken to perform each process is merely an example for convenience of explanation and may be changed to other numerical values.

In this example, an amount of time taken to perform all of the processes (1) through (3) included in the sequence is about 107 ms. Thus, the main control unit 210 may control the MRI data obtaining unit 10 to perform the sequence including the processes (1) through (3) for a total of at least four times during a t500 ms time period corresponding to one period of a normal heartbeat. The main control unit 210 may control the MRI data obtaining unit 10 to repeat the sequence in each period of a heartbeat until MRI data with respect to the subject region is obtained.

It should also be appreciated that the number of times the sequence is repeated in one period of a heartbeat may be modified according to a use environment of the MRI apparatus 1 or based on user settings.

According to various aspects, the navigator image may be a one-dimensional (1D) image, a two-dimensional (2D) image, and a three-dimensional (3D) image. This is because the processes (1) through (3) may be repeatedly performed within one period of a heartbeat, even when considering an amount of time required to obtain a 2D or 3D navigator image. For example, a navigator technique used in the MRI apparatus 1 may be any navigator technique such as 1D PACE, 2D PACE, 3D PACE, 1D Navigator, 1D MotionTrak, or 2D MotionTrak, without being limited to any specific one.

Referring to FIG. 4, MRI data obtained in each of Sequence 1, Sequence 2, Sequence 3, and Sequence 4 may be data of a different slice of the subject region and may be based on an ordering of the different slices. As will be described below, MRI data obtained in each sequence may be based on a determination made by the MRI data determining unit 230.

Referring back to FIG. 1, the main control unit 210 may control the overall operations of the MRI apparatus 1 such as operations of the main magnetic field coil, the gradient coil, the RF coil, the magnet room, and so forth.

The navigator image determining unit 220 may determine whether a navigator image obtained from a current sequence is an image corresponding to a point of time at which the subject's breathing is paused. For example, the navigator image determining unit 220 may analyze the position of the diaphragm of the subject included in the navigator image but is not limited thereto. As another example, the navigator image may also use a part of the subject other than the diaphragm, as will be understood by those of ordinary skill in the art.

Figure 5:
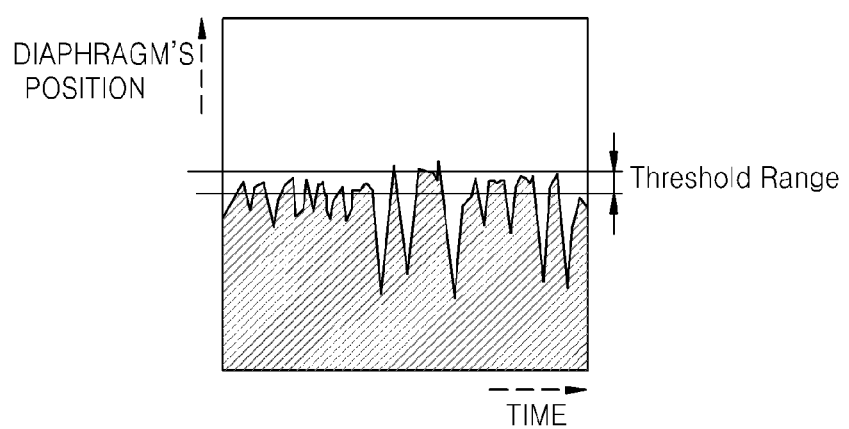
FIG. 5 is a diagram illustrating an example of a histogram of a position of a diaphragm used in a navigator image determining unit.

FIG. 5 illustrates an example of a histogram at a position of a diaphragm used in the navigator image determining unit 220. For example, the MRI apparatus 1 may calculate a histogram regarding a position of a diaphragm that is a criterion for determining a point of time at which breathing is paused, prior to execution of a sequence for obtaining MRI data. That is, prior to execution of a sequence for obtaining MRI data, the MRI apparatus 1 may obtain an MRI image of a diaphragm region that moves with breathing, select a navigator position of the diaphragm region, and continuously obtain a navigator image of the diaphragm for 30-45 seconds to calculate a histogram regarding the navigator position, thereby estimating a threshold range of the position of the diaphragm corresponding to expiration.

For example, if a histogram corresponding to 50 expirations of the subject is calculated during a period of 30-45 seconds, the MRI apparatus 1 may estimate a threshold range based on an average position of a diaphragm with respect to the positions of the diaphragm obtained in the 50 repetitions. Because such a time or number is merely an example for convenience of explanation, it may be changed to other numerical values. Information about the threshold range corresponding to expiration estimated from the histogram may be previously stored in a storage unit (not shown) of the MRI apparatus 1.

The navigator image determining unit 220 may use the estimated threshold range of the tracked expiration position of the diaphragm as a criterion (threshold range) for determining an expiration point of time of the diaphragm to be obtained in a subsequent sequence. For example, the navigator image determining unit 220 may determine whether or not the position of the diaphragm in the navigator image obtained from Sequence 1 of FIG. 4 is within the threshold range shown in FIG. 5. If the diaphragm's position is within the threshold range, the navigator image determining unit 220 may determine that the navigator image corresponds to the expiration point of time. As another example, if the diaphragm's position is not within the threshold range, the navigator image determining unit 220 may determine that the navigator image corresponds to a point of time at which breathing is not paused.

The determination scheme of the navigator image determining unit 220 may be applied to a 2D or 3D navigator image as well as a 1D navigator image. In this case, the determination scheme of the navigator image determining unit 220 described using FIG. 5 is merely intended as an example, and it should be appreciated that the expiration point of time of the diaphragm may be determined by other already-known schemes using a 1D, 2D, or 3D navigator image.

The MRI data determining unit 230 may determine MRI data to be obtained during a next-order sequence based on the determination result of the navigator image determining unit 220. For example, as described with reference to FIG. 4, MRI data obtained from each of Sequence 1, Sequence 2, Sequence 3, and Sequence 4 may be data from a different slice of a subject region and corresponds to a different line (301, 302, 303 or 304 of FIG. 3) of the k-space. Thus, if MRI data corresponding to the line 301 of the k-space of FIG. 3 is first obtained from the current sequence, Sequence 1, then the MRI data determining unit 230 may next make a determination to obtain MRI data corresponding to the line 302 of the k-space in the next-order sequence, Sequence 2.

However, the determination of the MRI data determining unit 230 may be based on the determination result of the navigator image determining unit 220 as previously described. For example, to prevent display quality deterioration as shown in FIG. 2A, each line of the k-space may correspond to MRI data obtained at a point of time at which breathing is paused (expiration point of time).

More specifically, if the navigator image determining unit 220 determines that a navigator image obtained from Sequence 1 is an image obtained at a point of time at which breathing is paused (expiration point of time), MRI data 301 obtained in Sequence 1 is accurate data. In response to the determination result of the navigator image determining unit 220, in this example the MRI data determining unit 230 then determines to obtain next MRI data 302 of a next slice of the subject region in the next-order sequence, Sequence 2. In this example, the MRI data determining unit 230 determines MRI data to be obtained in sequences following Sequence 3 of FIG. 4.

The MRI data determining unit 230 may also consider a point of time at which heartbeat is paused, by using a separate electrocardiogram (ECG) measurement device (not shown) attached to the subject, as well as a point of time at which breathing is paused (expiration point of time) that may be determined in the navigator image determining unit 220.

Figure 6:
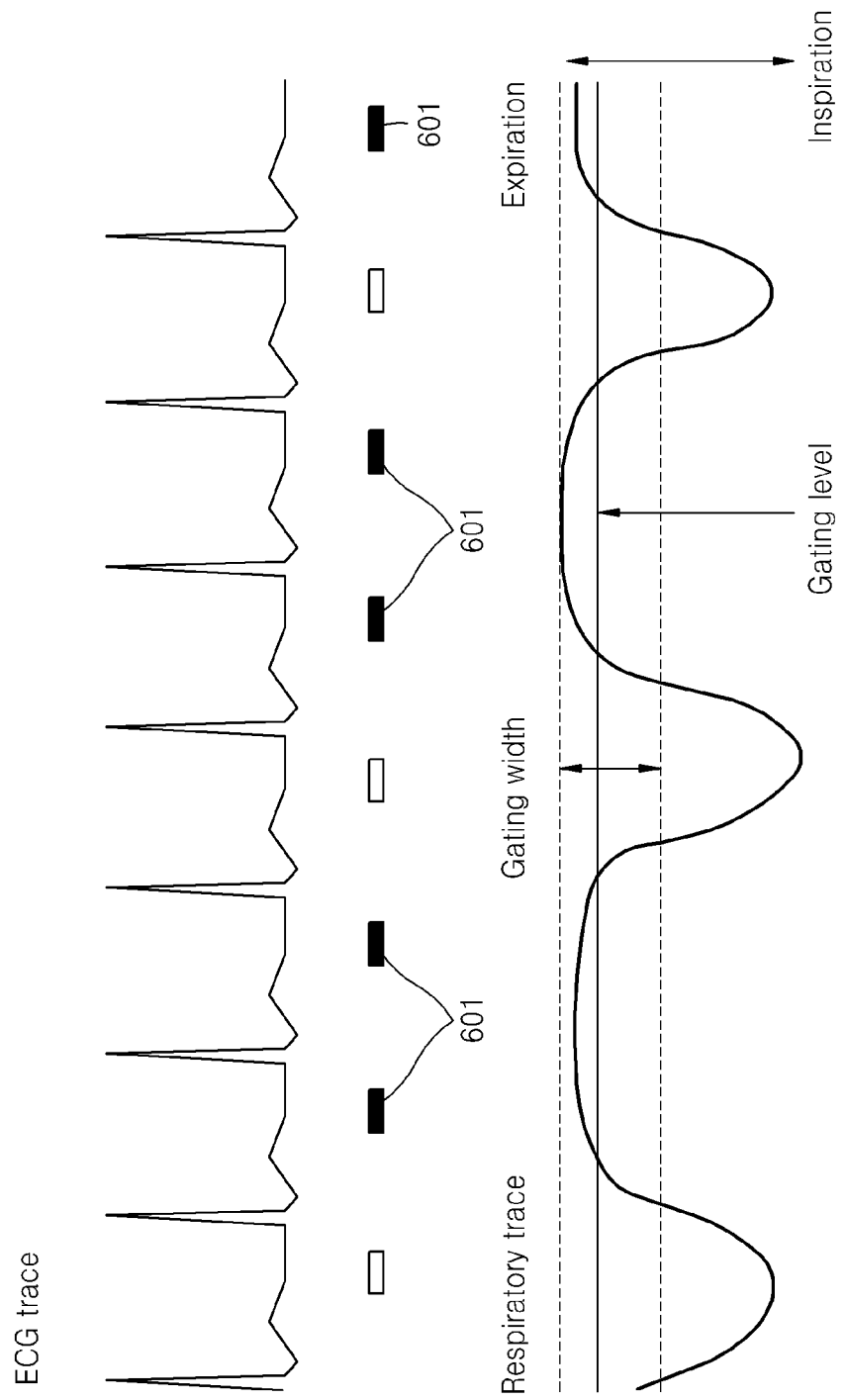
FIG. 6 is a timing diagram illustrating an example of MRI data obtained by an MRI data determining unit.

FIG. 6 is a timing diagram which illustrates an example of determining MRI data by the MRI data determining unit 230. Referring to FIG. 6, the MRI data determining unit 230 may determine MRI data to be obtained next such that new MRI data is obtained at every period 601 such that a point of time at which breathing is paused (expiration point of time) as determined by the navigator image determining unit 220 and a point of time at which heartbeat is paused as determined by the ECG measuring device overlap with each other.

Referring back to FIG. 1, the updating unit 240 may update a preset criterion (threshold range) of a previous sequence for determining a point of time at which breathing is paused, by using the navigator image obtained from the current sequence.

Referring to FIG. 4, as previously described, prior to execution of Sequence 1, information about a threshold range corresponding to expiration may be preset and stored in a storage unit (not shown) of the MRI apparatus 1. For example, when a histogram corresponding to 50 expirations of the subject is calculated for 30-45 seconds the MRI apparatus 1 may preset a threshold range (See FIG. 5) based on an average position of the diaphragm with respect to the 50 expirations during the 30-45 second time periods of expiration.

The updating unit 240 may update the preset threshold range using a position of the diaphragm in a navigator image obtained from the current sequence. For example, in the previously described example, by using a $51^{st}$ expiration position of the diaphragm determined by analysis of the navigator image obtained during execution of Sequence 1, the updating unit 240 may update the preset threshold range the average diaphragm position that is based on the previous 50 expirations.

The subject may unconsciously or consciously move to the left/right or up/down while the MRI data obtaining unit 10 executes the sequences. As a result, positions of the diaphragm indicated in the navigator images obtained during execution of sequences following a certain sequence may be outside of a preset threshold range. In this case, the conventional MRI apparatus stops all processes and performs a 30-45 second operation of newly setting a threshold range.

In contrast, according to various aspects, the updating unit 240 may update a threshold range using the position of the diaphragm as indicated by the navigator image obtained with respect to the execution of each sequence, thus maintaining a threshold range that is robust against movement of the subject. That is, because the updating unit 240 may update the dynamic and adaptive threshold range in real time, it is not necessary to perform the operation of newly setting the threshold range due to movement of the subject, such as in the conventional MRI apparatus.

Figure 7:
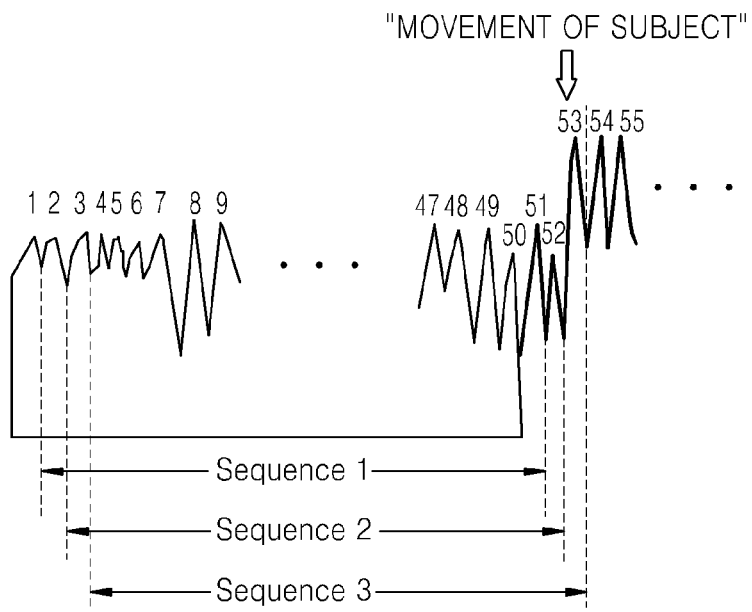
FIG. 7 is a diagram illustrating an example of a process in which an updating unit updates a threshold range in a moving window manner.

FIG. 7 illustrates an example of a process in which the updating unit 240 updates the threshold range in a manner inclusive of a moving window scheme. Referring to FIG. 7, when Sequence 1 is executed, the updating unit 240 may update a preset threshold range (average diaphragm position of 50 times of expiration) using the $51^{st}$ expiration position of the diaphragm obtained in Sequence 1. In this example, the updating unit 240 may add $51^{st}$ expiration position of the diaphragm to the histogram and may remove a $1^{st}$ expiration position of the diaphragm, thus updating the threshold range in the form of a moving window that includes 50 total expirations. Thereafter, when Sequence 2 is executed, the updating unit 240 may update the threshold range which is set in Sequence 1, using a $52^{nd}$ expiration position of the diaphragm obtained in Sequence 2. In this example, the updating unit 240 may add the $52^{nd}$ expiration position of the diaphragm to the histogram and remove a $2^{nd}$ expiration position of the diaphragm, again updating the threshold range in the moving window scheme Likewise, when Sequence 3 is executed, the updating unit 240 updates the threshold range which is set in Sequence 2, using a $53^{rd}$ expiration position of the diaphragm obtained in Sequence 3. In this case, the analyzed $53^{rd}$ expiration position is different from the positions in Sequence 1 and Sequence 2. In this case, it can be seen that there is movement of the subject. Therefore, the updating unit 240 makes an update indicating that the $53^{rd}$ expiration position of the diaphragm obtained from Sequence 3 corresponds to a new expiration position after movement of the subject. Likewise, the updating unit 240 adds the $53^{rd}$ expiration position of the diaphragm to the histogram and removes a $3^{rd}$ expiration position of the diaphragm, thus updating the threshold range in the moving window scheme.

While the updating unit 240 updates the threshold range in the moving window scheme in FIG. 7, the updating unit 240 may set the threshold range based on an average position of expiration positions of the diaphragm accumulated during execution of Sequence 1, Sequence 2, etc., without being limited to the moving window scheme. The updating unit 240 may also update the threshold range using other schemes. That is, it should be appreciated that the updating scheme of the updating unit 240 is not particularly limited.

Referring back to FIG. 1, the navigator image determining unit 220 may determine whether a navigator image obtained in the current sequence is an image corresponding to a point of time at which breathing of the subject is paused, using the threshold range updated in the previous sequence.

The MRI data extracting unit 250 may extract MRI data obtained at a point of time at which the heartbeat and the breathing of the subject are paused, based on the obtained navigator images. For example, the MRI data extracting unit 250 may extract MRI data obtained from sequences corresponding to a period (601 of FIG. 6) in which a point of time at which breathing is paused (expiration point of time) as determined by the navigator image determining unit 220 and a point of time at which heartbeat is paused as determined by the ECG measuring device, overlap with each other.

Thus, the MRI data extracted by the MRI data extracting unit 250 may be data corresponding to all lines of the k-space prior to transformation of an MRI image of the subject region. Upon completion of extracting, the MRI image generating unit 260 may perform image processing that incorporates fat suppression in order to transform the extracted MRI data, thus generating the MRI image of the subject region.

According to various aspects, because the MRI data obtained after movement of the subject also exists in the extracted MRI data, the extracted MRI data obtained after movement of the subject may have a phase that is different from extracted MRI data obtained prior to movement of the subject. Therefore, the MRI image generating unit 260 may correct a phase difference resulting from movement of the subject, which is mapped to the respective MRI data. As a result of the correction of the phase difference, all of the MRI data may be considered as being obtained with respect to a common posture of the subject, and a final MRI image may be generated.

The MRI apparatus 1 performs image processing that incorporates fat suppression after collection of the MRI data for generating the MRI image has been completed. For example, image processing that incorporates fat suppression may be replaced with image processing that incorporates fat suppression as known in the MRI field.

According to various aspects, the MRI apparatus 1 may obtain a greater amount of MRI data during one period of a heartbeat in comparison to conventional methods, thus generating an MRI image at high speed. The MRI apparatus 1 may obtain the MRI data while updating the position of the diaphragm in real time, such that the accurate MRI image may be generated at high speed without the need to stop and restart all processes every time a subject moves.

Figure 8:
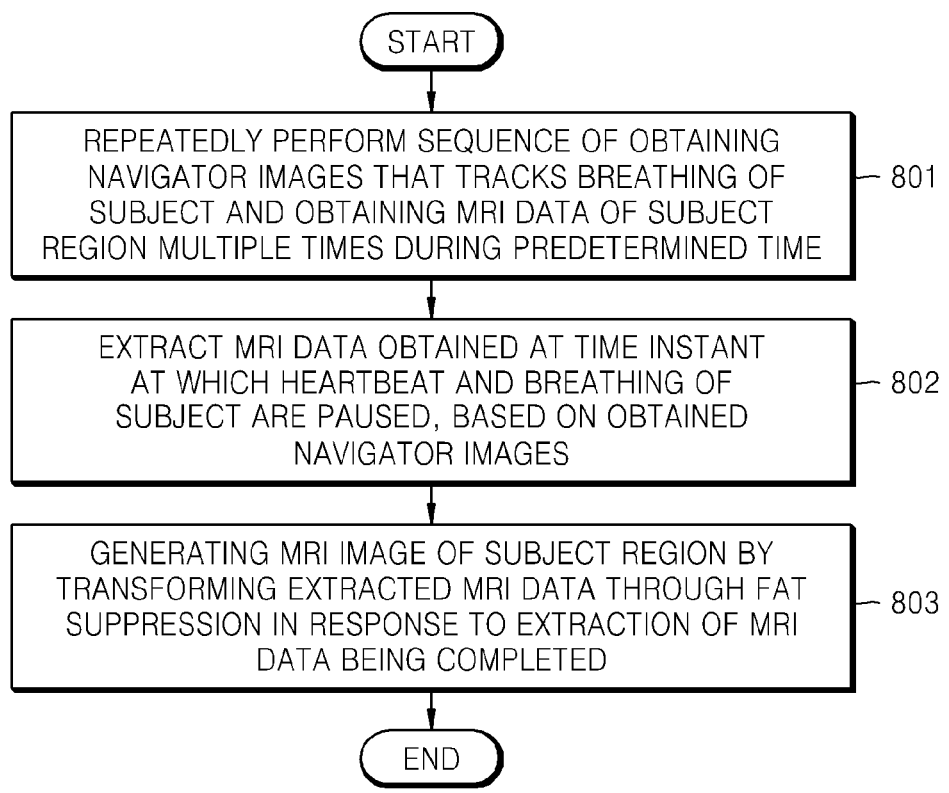
FIG. 8 is a diagram illustrating an example of a method of obtaining an MRI image.

FIG. 8 illustrates an example of a method of obtaining an MRI image. Referring to FIG. 8, the method includes operations which may be time-serially processed by the MRI apparatus 1 of FIG. 1 or another apparatus. Although not described, the foregoing description referring to FIG. 1 is also applied to the following method of obtaining the MRI image.

In 801, the main control unit 210 may control a sequence of repeating, for one or more times within a predetermined time, a process of obtaining MRI data of a subject region after obtaining a navigator image which tracks breathing of the subject.

In 802, the MRI data extracting unit 250 may extract MRI data obtained at a point of time at which heartbeat of the subject and breathing of the subject are paused, based on the obtained navigator images.

In 803, the MRI image generating unit 260 may perform image processing that incorporates fat suppression to transform the extracted MRI data, thus generating the MRI image of the subject region.

FIG. 9 illustrates an example of a method of obtaining an MRI image as shown in FIG. 8. Although not described in detail below, the foregoing description referring to FIG. 1 is also applied to the method of obtaining the MRI image.

Operations 901 and 902 correspond to pre-processing for setting a threshold range of the expiration position of the diaphragm using the navigator image that may be performed before the MRI data obtaining unit 10 obtains MRI data of the subject region.

In 901, the MRI apparatus 1 obtains an MRI image of a diaphragm portion that moves with breathing, and selects the navigator position of the diaphragm portion.

In 902, the MRI apparatus 1 continuously obtains the navigator image of the diaphragm portion over a period of time, for example, 30-45 seconds to calculate a histogram of the navigator position, thus estimating a threshold range of the diaphragm's position corresponding to expiration. Upon completion of the estimation of the threshold range, the MRI apparatus 1 may preset the estimated threshold range as a criterion in a sequence to be later executed for determining a point of time at which breathing is paused, and may store the criterion in the storage unit (not shown).

In 903, the main control unit 210 may obtain the navigator image and execute a sequence for obtaining the MRI data of a region of the subject.

In 904, the navigator image determining unit 220 may determine whether the navigator image obtained in a currently executed sequence is an image corresponding to a point of time at which breathing of the subject is paused. In addition, the navigator image determining unit 220 may also determine a point of time at which heartbeat is paused. As an example the heartbeat may be measured by a separate ECG measuring device (not shown).

If in 904 it is determined that the navigator image is the image corresponding to the point of time at which breathing of the subject is paused, operation 905 is then executed, otherwise, operation 906 is executed.

In 905, the MRI data determining unit 230 may determine MRI data to be obtained from the next-order sequence based on the determination result of the navigator image determining unit 220.

In 906, the updating unit 240 may update a criterion (threshold range) which had been preset in a previous sequence and that is used for determining a point of time at which breathing is paused. For example, the criterion may be updated using the navigator image obtained in the current sequence. If the current sequence, however, is an initial sequence, the updating unit 240 may update the criterion (threshold range) to that of the criterion (threshold range) previously stored in the storage unit (not shown).

Unless it is determined in 904 that the navigator image is the image corresponding to the point of time at which breathing of the subject is paused, operation 906 is performed wherein the updating unit 240 updates the criterion (threshold range) to again obtain the MRI data.

In 907, the main control unit 210 may determine whether the obtaining of all MRI data regarding the subject region has been completed. For example, the main control unit 210 may determine whether or not MRI data to be obtained by the MRI data obtaining unit 10 still remains. If the obtaining of the MRI data is completed in operation 907, operation 908 is performed. Otherwise, operation 903 may be performed to execute the next-order sequence.

In 908, the MRI data extracting unit 250 may extract MRI data obtained at a point of time at which heartbeat and breathing of the subject are paused. The point of time at which heartbeat and breathing of the subject are paused is indicated by the obtained navigator images.

If the MRI data extracting unit 250 completes extraction, operation 909 may be performed and the MRI image generating unit 260 may transform the extracted MRI data by image processing that incorporates fat suppression, thus generating the MRI image of the subject portion.

FIG. 10 illustrates an example of an MRI system 100. Referring to FIG. 10, the MRI system 100 includes an MRI device 110, an MRI processing device 130, and an image display device 150. Respective devices of the MRI system 100 may be physically separated or integrated. In this example, the MRI data obtaining unit 10 of FIG. 1 described above may correspond to the MRI device 110 of the MRI system 100, and the processor 20 of FIG. 1 may correspond to the MRI processing device 130 of the MRI system 100.

The MRI device 110 may receive a control signal for capturing an MRI image from the MRI processing device 130. Based on the control signal, the MRI device 110 may obtain a magnetic resonance signal used to generate the MRI image from a subject 114 located in a magnet system 112, and output the magnetic resonance signal to the MRI processing device 130. The subject 114 may be moved into the magnet system 112 by means of a cradle 116.

The MRI processing device 130 may receive the magnetic resonance signal from the MRI device 110, reconstruct the magnetic resonance signal to generate the MRI image of the subject 114, and forward the generated MRI image to the image display device 150. For example, the MRI processing device 130 may include a user interface to receive control information from a user, an image processor to reconstruct the magnetic resonance signal to generate the MRI image, a storage unit to store the generated MRI image and various information, and an input/output unit to connect with the MRI device 110 and the image display device 150.

The image display device 150 may receive the MRI image generated from the MRI processing device 130 and display the magnetic resonance image on a display unit.

According to various aspects, a greater amount of MRI data may be obtained during one period of a heartbeat, thereby generating an MRI image at high speed such as in real time. Moreover, the MRI data may be obtained while updating the position of the diaphragm in real time such that the accurate MRI image may be generated at high speed without stopping of processes each time a subject moves.

Program instructions to perform a method described herein, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of computer-readable storage media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable storage mediums. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein. Also, the described unit to perform an operation or a method may be hardware, software, or some combination of hardware and software. For example, the unit may be a software package running on a computer or the computer on which that software is running. A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of obtaining a magnetic resonance imaging (MRI) image by an MRI apparatus comprising a processor, the method comprising:
repeatedly performing a sequence of obtaining a navigator image that tracks breathing of a subject and obtaining MRI data of a subject region, multiple times, during a predetermined time period;
extracting MRI data obtained at a point of time at which a heartbeat and the tracked breathing of the subject are paused, based on the obtained navigator images; and
generating an MRI image of the subject region by transforming the extracted MRI data through fat suppression, in response to the extraction of the MRI data being completed,
wherein the performing of the sequence comprises
determining whether a navigator image obtained in a current sequence is an image taken at a point of time at which the breathing of the subject is paused; and
determining MRI data to be obtained in a next-order sequence based on whether the navigator image obtained in the current sequence is an image corresponding to the point of time at which breathing of the subject is paused.

2. The method of claim 1, wherein the sequence is performed at least twice during a period of a single heartbeat of the subject.

3. The method of claim 1, further comprising:
updating a preset criterion of a previous sequence for determining the point of time at which the breathing of the subject is paused, based on the navigator image obtained in the current sequence,
wherein the determining whether the navigator image obtained in a current sequence is an image taken at a point of time at which breathing of the subject is paused is based on the criterion which is preset in the previous sequence.

4. The method of claim 3, wherein the determining whether the navigator image obtained in the current sequence and the updating of the criterion are performed by analyzing a position of a diaphragm of the subject included in the obtained navigator image.

5. The method of claim 3, wherein the updating of the preset criterion comprises updating the criterion in a moving window scheme, by analyzing a position of a diaphragm of the subject included in the navigator image obtained in the current sequence.

6. The method of claim 1, wherein the navigator image obtained is one of a one-dimensional (1D) image, a two-dimensional (2D) image, and a three-dimensional (3D) image.

7. The method of claim 1, wherein the MRI data obtained during the performing of a sequence is data corresponding to one line of k-space.

8. A non-transitory computer-readable storage medium comprising a program that when executed by a computer, causes the computer to perform the method of claim 1.

9. A method of obtaining a magnetic resonance imaging (MRI) image by an MRI apparatus comprising a processor, the method comprising:
obtaining a navigator image which tracks a position of a predetermined region of a subject that moves due to breathing of the subject;
obtaining MRI data regarding a subject region of the subject;
determining a point of time at which the breathing of the subject is paused, based on the tracked position of the predetermined region of the obtained navigator image;
determining MRI data to be obtained in a next-order sequence based on whether the navigator image obtained in a current sequence is an image corresponding to the point of time at which breathing of the subject is paused; and
updating a preset criterion for determining the point of time at which the breathing of the subject is paused, based on the tracked position of the predetermined region,
wherein the obtaining the navigator image, the obtaining the MRI data, the determining the point of time, the determining the MRI data, and the updating are performed at least twice during a single heartbeat of the subject.

10. The method of claim 9, further comprising:
extracting MRI data obtained at a point of time at which the heartbeat and breathing of the subject are paused, based on a result of the determining the point of time at which the breathing of the subject is paused; and
generating an MRI image of the subject region by transforming the extracted MRI data through fat suppression, in response to the extraction of the MRI data being completed.

11. A magnetic resonance imaging (MRI) apparatus for obtaining an MRI image, the MRI apparatus comprising:
a main control unit configured to repeatedly perform a sequence of obtaining a navigator image that tracks breathing of a subject and obtaining MRI data of a subject region, multiple times, during a predetermined time period;
an MRI data extracting unit configured to extract MRI data obtained at a point of time at which a heartbeat and the tracked breathing of the subject are paused, based on the obtained navigator images;
an MRI image generating unit configured to generate an MRI image of the subject region by transforming the extracted MRI data through fat suppression, in response to the extraction of the MRI data being completed;
a navigator image determining unit configured to determine whether a navigator image obtained in a current sequence is an image corresponding to a point of time at which the breathing of the subject is paused; and
an MRI data determining unit configured to determine MRI data to be obtained in a next-order sequence based on a result of the determining whether the navigator image obtained in the current sequence is an image corresponding to the point of time at which breathing of the subject is paused,
wherein the main control unit controls the next-order sequence based on the result of the determining MRI data to be obtained in the next-order sequence.

12. The MRI apparatus of claim 11, wherein the main control unit controls the sequence to be performed at least twice during a period of a single heartbeat of the subject.

13. The MRI apparatus of claim 11, further comprising:
an updating unit configured to update a preset criterion for determining the point of time at which the breathing of the subject is paused, based on the navigator image obtained in the current sequence,
wherein the navigator image determining unit is configured to determine whether the navigator image is an image corresponding to a point of time at which the breathing of the subject is paused, based on the criterion which is preset in the previous sequence.

14. The MRI apparatus of claim 13, wherein the updating unit is configured to update the preset criterion in a moving window scheme, by analyzing a position of a diaphragm of the subject included in the navigator image obtained in the current sequence.

15. The MRI apparatus of claim 11, wherein the navigator image obtained during a sequence is one of a one-dimensional (1D) image, a two-dimensional (2D) image, and a three-dimensional (3D) image.

16. The MRI apparatus of claim 11, wherein the MRI data obtained during a sequence is data corresponding to one line of a k-space.

17. A magnetic resonance imaging (MRI) apparatus for obtaining an MRI image, the MRI apparatus comprising:
an MRI data obtaining unit configured to obtain a navigator image which tracks a position of a predetermined region of a subject that moves due to breathing of the subject, and MRI data regarding a subject region of the subject;
a navigator image determining unit configured to determine a point of time at which the breathing of the subject is paused, based on the tracked position of the predetermined region in the obtained navigator image;
an MRI data determining unit configured to determine MRI data to be obtained in a next-order sequence based on whether the navigator image obtained in a current sequence is an image corresponding to the point of time at which breathing of the subject is paused;
an updating unit configured to update a preset criterion for determining the point of time at which the breathing of the subject is paused, based on the tracked position of the predetermined region; and
a main control unit configured to control the MRI data obtaining unit to obtain the navigator image and to obtain the MRI data at least twice during a period of a single heartbeat of the subject.

18. The MRI apparatus of claim 17, further comprising:
an MRI data extracting unit configured to extract MRI data obtained at a point of time at which the heartbeat and breathing of the subject are paused, based on a result of the determining the point of time at which the breathing of the subject is paused; and
an MRI image generating unit configured to generate an MRI image of the subject region by transforming the extracted MRI data through fat suppression, in response to the extraction of the MRI data being completed.

* * * * *